United States Patent
Takano

(10) Patent No.: US 12,341,024 B2
(45) Date of Patent: Jun. 24, 2025

(54) METHOD FOR MANUFACTURING SEMICONDUCTOR DEVICE INCLUDING RESIN LAYERS

(71) Applicant: KIOXIA CORPORATION, Tokyo (JP)

(72) Inventor: Eiji Takano, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 544 days.

(21) Appl. No.: 17/684,137

(22) Filed: Mar. 1, 2022

(65) Prior Publication Data

US 2023/0063204 A1 Mar. 2, 2023

(30) Foreign Application Priority Data

Sep. 1, 2021 (JP) ................. 2021-142606

(51) Int. Cl.
*H01L 21/469* (2006.01)
*H01L 21/463* (2006.01)
(Continued)

(52) U.S. Cl.
CPC .......... *H01L 21/469* (2013.01); *H01L 21/463* (2013.01); *H01L 21/565* (2013.01);
(Continued)

(58) Field of Classification Search
CPC ... H01L 21/469; H01L 21/463; H01L 21/565; H01L 21/568; H01L 21/6835; H01L 21/6836; H01L 21/561; H01L 23/3128; H01L 25/0657; H01L 2221/68331; H01L 2221/68345; H01L 2221/68359; H01L 2221/68363; H01L 2221/68377; H01L 2225/06562; H01L 2225/06565; H01L 21/60; H01L 21/62; H01L 21/64; H01L 21/70; H01L 21/77; H01L 21/84; H01L 23/16; H01L 23/18; H01L 23/24;
(Continued)

(56) References Cited

U.S. PATENT DOCUMENTS 10,079,161 B2  9/2018  Inaoka et al.
10,636,742 B2  4/2020  Belonio, Jr. et al.
(Continued)

FOREIGN PATENT DOCUMENTS

JP  H10209206 A  *  8/1998  ......... H01L 2224/16
JP  2009064849 A  *  3/2009  ............. H01L 24/73
(Continued)

OTHER PUBLICATIONS

Takase (TW 201722681).*

*Primary Examiner* — Evan G Clinton
*Assistant Examiner* — Douglas Yap
(74) *Attorney, Agent, or Firm* — Kim & Stewart LLP

(57) ABSTRACT

According to one embodiment, a method for manufacturing a semiconductor device includes placing a semiconductor chip on a first surface of a support substrate, forming a first resin layer covering the semiconductor chip on the first surface, and forming a second resin layer on a second surface of the support substrate. The second surface is opposite the first surface. In some examples, the second resin layer can be formed to counteract or mitigate warpage of the support substrate that might otherwise result from use of the first resin layer.

20 Claims, 13 Drawing Sheets

(51) Int. Cl.
*H01L 21/56* (2006.01)
*H01L 21/683* (2006.01)
*H01L 23/31* (2006.01)
*H01L 25/065* (2023.01)

(52) U.S. Cl.
CPC ........ *H01L 21/568* (2013.01); *H01L 21/6835* (2013.01); *H01L 21/6836* (2013.01); *H01L 23/3128* (2013.01); *H01L 25/0657* (2013.01); *H01L 2221/68331* (2013.01); *H01L 2221/68345* (2013.01); *H01L 2221/68359* (2013.01); *H01L 2221/68363* (2013.01); *H01L 2225/06562* (2013.01); *H01L 2225/06565* (2013.01)

(58) Field of Classification Search
CPC ....... H01L 23/48; H01L 23/538; H01L 24/01; H01L 24/26; H01L 24/30; H01L 24/83; H01L 24/95; H01L 24/97; H01L 2924/0665; H01L 2924/0951; H01L 2224/8085; H01L 2224/8185; H01L 2224/8285; H01L 2224/8385; H01L 2224/8485; H01L 2224/8585; H01L 2224/8685; H01L 2224/8049; H01L 2224/8059; H01L 2224/8069; H01L 2224/8079; H01L 2224/8349; H01L 2224/8359; H01L 2224/8369; H01L 2224/8379; H01L 21/6837
See application file for complete search history.

(56) References Cited

U.S. PATENT DOCUMENTS

| | | | |
|---|---|---|---|
| 10,720,405 | B2 | 7/2020 | Moitzi et al. |
| 2015/0179560 | A1* | 6/2015 | Arisaka ............ H01L 23/49827 257/777 |
| 2017/0294389 | A1* | 10/2017 | Factor ................. H01L 25/0657 |
| 2019/0051614 | A1* | 2/2019 | Dimaano, Jr. ...... H01L 23/3128 |
| 2019/0267344 | A1 | 8/2019 | Seddon et al. |
| 2021/0175177 | A1* | 6/2021 | Kim .................... H01L 23/5386 |
| 2021/0305228 | A1* | 9/2021 | Yang ................. H01L 23/49816 |

FOREIGN PATENT DOCUMENTS

| | | | | |
|---|---|---|---|---|
| JP | 2017228692 A | * | 12/2017 | ....... H01L 2224/162 |
| JP | 2018006408 A | | 1/2018 | |
| JP | 2019169704 A | | 10/2019 | |
| TW | 200529333 A | * | 9/2005 | ............ H01L 21/56 |
| TW | 201722681 A | * | 7/2017 | ....... H01L 21/67126 |
| TW | 202043406 A | * | 12/2020 | ......... H01L 2224/18 |

* cited by examiner

METHOD FOR MANUFACTURING SEMICONDUCTOR DEVICE INCLUDING RESIN LAYERS

CROSS-REFERENCE TO RELATED APPLICATION

This application is based upon and claims the benefit of priority from Japanese Patent Application No. 2021-142606, filed Sep. 1, 2021, the entire contents of which are incorporated herein by reference.

FIELD

Embodiments described herein relate generally to a method for manufacturing a semiconductor device.

BACKGROUND

In a packaging process of a semiconductor device, semiconductor chips can be mounted to a support wafer and then covered with a mold resin. After this, singulation of the wafer is performed to permit separation of individual semiconductor chips. However, due to such things as a difference in the coefficient of thermal expansion of the support wafer and the mold resin, the support wafer may warp after the mold resin is applied. The warpage may affect a subsequent process step.

DETAILED DESCRIPTION

Figure 1:
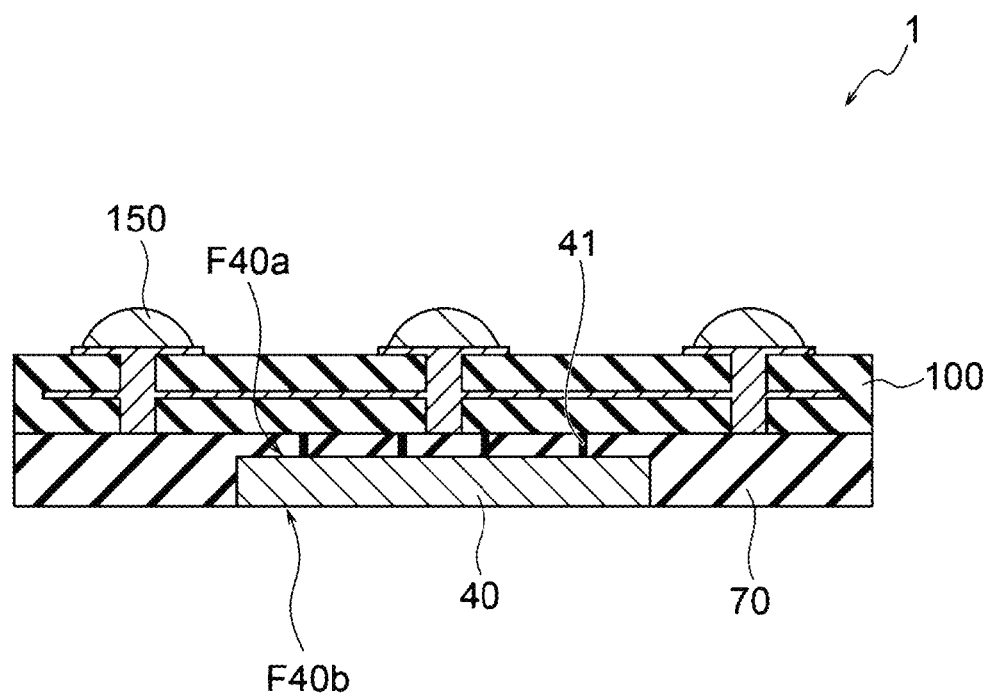
FIG. 1 is a cross-sectional view illustrating an example of a configuration of a semiconductor device according to a first embodiment.

Embodiments provide a method for manufacturing a semiconductor device preventing warpage of a support.

In general, according to one embodiment, a method of manufacturing a semiconductor device include placing a semiconductor chip on a first surface of a support substrate. A first resin layer covering the semiconductor chip on the first surface is then formed. A second resin layer is formed on a second surface of the support substrate. The second surface is opposite the first surface.

Hereinafter, certain example embodiments according to the present disclosure will be described with reference to the drawings. These example embodiments do not limit the present disclosure. In the following embodiments, the vertical direction refers to a relative direction matching a stacking direction of semiconductor chips and may be referred to as an up or down direction. The vertical direction of the description may differ from the direction of gravitational acceleration. The drawings are schematic or conceptual, and the dimensions, sizes, proportions, and the like of each part are not always the same as those in an actual embodiment. In the specification and the drawings, the same elements, components, or aspects are denoted by the same reference numerals, and additional description thereof may be omitted as appropriate after an initial description.

First Embodiment

FIG. 1 is a cross-sectional view illustrating an example of a configuration of a semiconductor device 1 according to a first embodiment. The semiconductor device 1 includes a semiconductor chip 40, a connection pillar 41, a resin layer 70, a redistribution layer 100 (also referred to as a board 100 in some instances), and a metal bump 150. The semiconductor device 1 is, for example, a semiconductor package such as a large scale integration (LSI) package.

The semiconductor chip 40 is, for example, a controller chip that controls an external memory chip or the like in the semiconductor device 1, or any semiconductor chip on which LSI elements might be mounted. The semiconductor chip 40 is not limited to the controller chip, and can be, for example, a system-on-chip or the like. The semiconductor chip 40 has a surface F40a and a surface F40b opposite to the surface F40a. A semiconductor element or element(s) (not separately illustrated) such as a transistor or a capacitor is formed on the surface F40a of the semiconductor chip 40. The semiconductor element on the surface F40a of the semiconductor chip 40 is covered and protected with an insulating film (not separately illustrated). For this insulating film, for example, an inorganic insulating material such as a silicon oxide film or a silicon nitride film is used. An organic insulating material may be formed on the inorganic insulating material. In this context, an organic insulating material may be a resin, such as a phenol-based resin, a polyimide-based resin, a polyamide-based resin, an acrylic-based resin, an epoxy-based resin, a p-phenylene benzobisoxazole (PBO)-based resin, a silicone-based resin, or a benzocyclobutene-based resin, or a mixed or composite material of such resins.

The semiconductor chip 40 includes an electrode pad (not separately illustrated) exposed on the surface F40a.

The connection pillar 41 (also referred to as electrode 41) is connected to the electrode pad of the semiconductor chip 40 and extends in the Z-direction. A lower end of the connection pillar 41 is connected to the electrode pad of the semiconductor chip 40. An upper end of the connection pillar 41 reaches an upper surface of the resin layer 70 and is exposed on the upper surface thereof. The upper end of the connection pillar 41 is connected to an electrode pad of the redistribution layer 100. As the material of the connection pillar 41, for example, a conductive metal such as copper (Cu) may be used.

The resin layer 70 covers (seals) the semiconductor chip 40 and the connection pillar 41, but leaves exposed a tip of the connection pillar 41 on the upper surface thereof.

For the resin layer 70, an organic insulating material, such as a phenol-based resin, a polyimide-based resin, a polyamide-based resin, an acrylic-based resin, an epoxy-based resin, a p-phenylene benzobisoxazole (PBO)-based resin, a silicone-based resin, or a benzocyclobutene-based resin, or a mixed or composite material of these resins can be used.

The redistribution layer (RDL) 100 is provided on the resin layer 70 and is electrically connected to the connection pillar 41. The redistribution layer 100 is a multilayered interconnection substrate in which a plurality of interconnection layers and a plurality of insulating layers are stacked. The RDL 100 electrically connects the semiconductor chip 40 via the connection pillar 41 to the metal bump 150. FIG. 1 schematically illustrates an interconnection layer within the redistribution layer 100.

The metal bump 150 is provided on the redistribution layer 100 and is electrically connected to the interconnection layer of the redistribution layer 100. The metal bump 150 is used for connection with an external device. For the metal bump 150, for example, one of tin (Sn), silver (Ag), copper (Cu), gold (Au), palladium (Pd), bismuth (Bi), zinc (Zn), nickel (Ni), antimony (Sb), indium (In), or germanium (Ge) may be used. A composite or alloy of two or more of Sn, Ag, Cu, Au, Pd, Bi, Zn, Ni, Sb, In, or Ge may be used.

Next, a method for manufacturing the semiconductor device 1 will be described.

FIGS. 2A to 2H are cross-sectional views illustrating an example of the method for manufacturing the semiconductor device 1 according to the first embodiment.

Figure 2A:
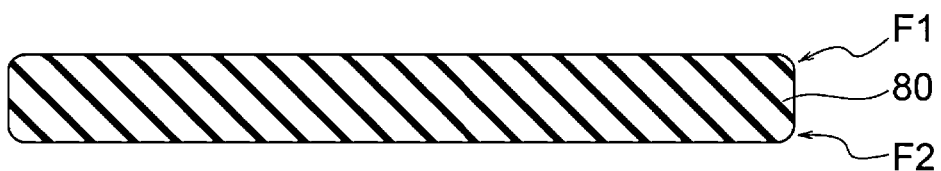
FIG. 2A to FIG. 2H are cross-sectional views illustrating aspects of a method for manufacturing a semiconductor device according to a first embodiment.

First, a support 80 is prepared as illustrated in FIG. 2A. The support 80 is, for example, a wafer shape. The support 80 has a surface F1 and a surface F2. The surface F1 is a semiconductor chip mounting surface. The surface F2 is a surface opposite to the surface F1. The material of the support 80 can be glass, silicon (Si), ceramic, resin, metal, or the like.

Figure 2B:
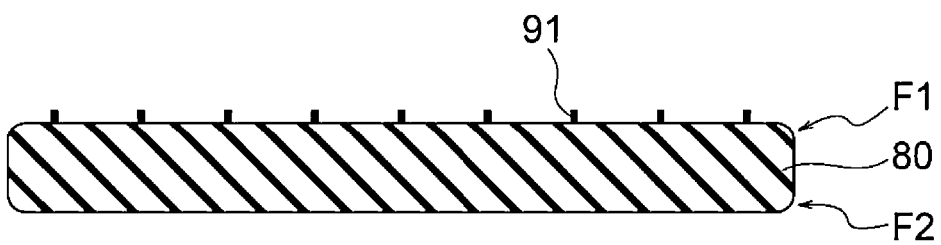

Next, as illustrated in FIG. 2B, a mark 91 is formed on the surface F1 of the support 80. The mark 91 is used for alignment for mounting the semiconductor chip 40 in the subsequent process illustrated of FIG. 2C.

Figure 2C:
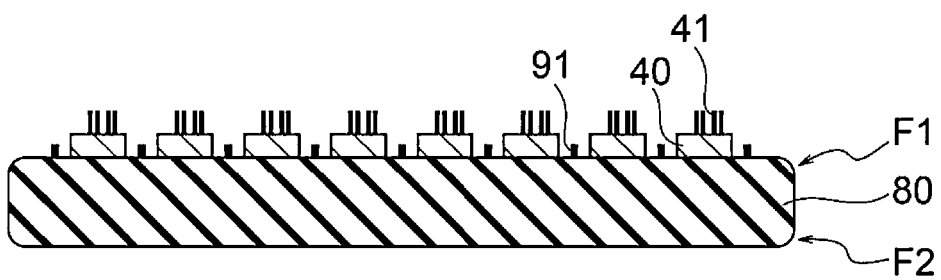

Next, as illustrated in FIG. 2C, the semiconductor chip 40 is provided on the surface F1 of the support 80. More specifically, according to the mark 91, semiconductor chips 40 are provided at a plurality of locations on the surface F1. The semiconductor chip 40 is fixed on the surface F1 using an adhesive layer. An electrode extending in the orthogonal direction from the surface F1 is formed on the semiconductor chip 40. The electrode is, for example, the connection pillar 41. In some examples, the connection pillar 41 may be formed in advance on the semiconductor chip 40, that is, before mounting of the semiconductor chip 40 on the support 80. The connection pillar 41 is formed by, for example, a plating method. As the material of the connection pillar 41, a conductive metal such as Cu can be used.

Figure 2D:
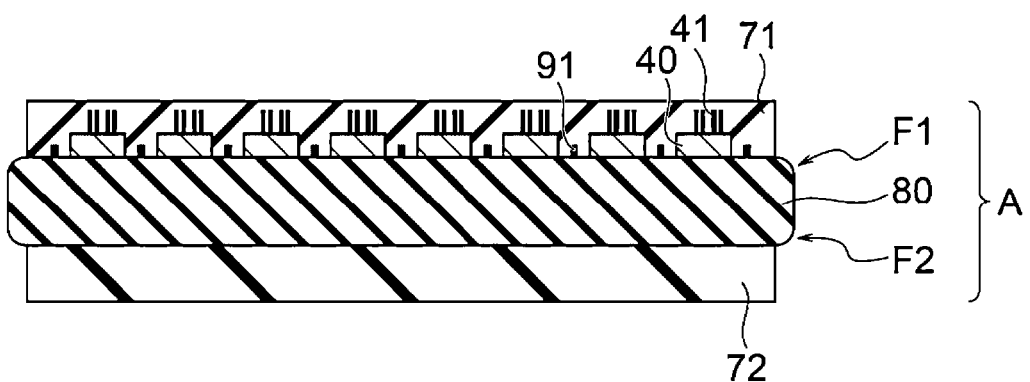

Next, as illustrated in FIG. 2D, a resin layer 71 covering the semiconductor chips 40 and the connection pillars 41 is formed on the surface F1. A resin layer 72 is formed on the surface F2. In the example illustrated in FIG. 2D, the resin layer 71 and the resin layer 72 are formed in parallel with each other. That is, the resin layers 71 and 72 are formed at the same time. The resin layer 71 is formed to a height exceeding the height of the connection pillar 41. In the example illustrated in FIG. 2D, the resin layers 71 and 72 have substantially the same thickness as each other and substantially the same width as each other.

In the example illustrated in FIG. 2D, the resin layers 71 and 72 are formed on the surface F1 and the surface F2, respectively. The support 80 on which the resin layers 71 and 72 have been formed is referred to as a support A with a resin layer. The thickness and area (size) of the resin layer 72 are substantially the same as the thickness and area of the resin layer 71. That is, the volume of the resin layer 72 is substantially the same as the volume of the resin layer 71. The material of the resin layer 72 is also substantially the same as the material of the resin layer 71. With this configuration, the resin layer 71 and the resin layer 72 will cause the support A with the resin layer to warp in opposite directions and to the same extent. As a result, the warpage is prevented by the cancellation (offsetting) of the warpages caused by the resin layers 71 and 72 with each other, and the subsequent processes can be performed more appropriately in view of the lack of warpage.

The resin layers 71 and 72 are formed on both sides of the support 80 by using, for example, a mold technique. For example, the support 80 and the semiconductor chip 40 are disposed in a cavity of a mold, and a molten resin material is introduced into the cavity to form the resin layers 71 and 72. In some examples, resin layers 71 and 72 may be formed by supplying the resin material into the mold in advance and then melting the resin material within the mold.

For the resin layers 71 and 72, a resin, such as an epoxy-based resin, a phenol-based resin, a polyimide-based resin, a polyamide-based resin, an acrylic-based resin, a PBO-based resin, a silicone-based resin, or a benzocyclobutene-based resin, or a mixed or composite material of such resins can be used. Examples of the epoxy resin are not particularly limited, and examples thereof include a bisphenol type epoxy resin, such as bisphenol A type, bisphenol F type, bisphenol AD type, bisphenol S type, or the like, a novolac type epoxy resin, such as phenol novolac type and cresol novolac type, a resorcinol type epoxy resin, an aromatic epoxy resin such as trisphenol methane triglycidyl ether, a naphthalene type epoxy resin, a fluorene type epoxy resin, a dicyclopentadiene type epoxy resin, a polyether modified epoxy resin, a benzophenone type epoxy resin, an aniline type epoxy resin, a NBR modified epoxy resin, a CTBN modified epoxy resin and a hydrogenated product of the resins. Among these resins, the naphthalene type epoxy resin and dicyclopentadiene type epoxy resin may be preferable because these epoxy resins have good adhesion to silicon. The benzophenone type epoxy resin may be preferable because this epoxy resin provides quick curing. These preferable epoxy resins may be used alone or in combination with other resins. A filler such as silica may be included in the resin layers 71 and 72.

After forming the resin layers 71 and 72, the resin layers 71 and 72 may be cured by heating in an oven or by irradiating with ultraviolet (UV) light.

Figure 2E:
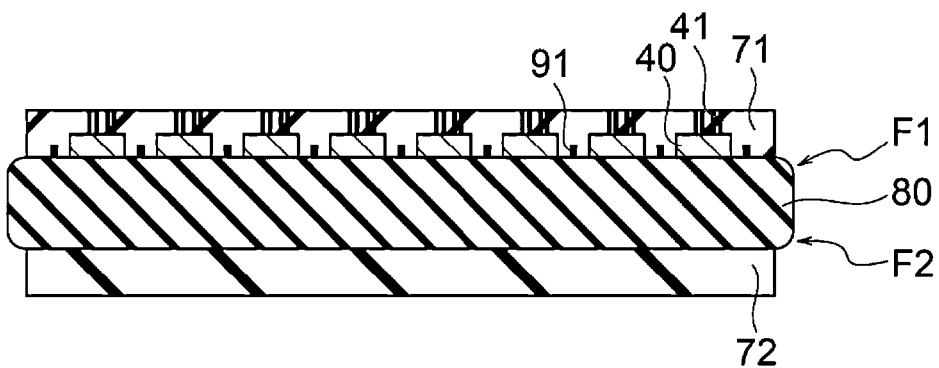

Next, as illustrated in FIG. 2E, the resin layer 71 is polished so that the upper end of the connection pillar 41 is exposed. For example, the resin layer 71 is polished by a chemical mechanical polishing (CMP) method, a mechanical polishing method, or the like until the connection pillar 41 is exposed.

Figure 2F:
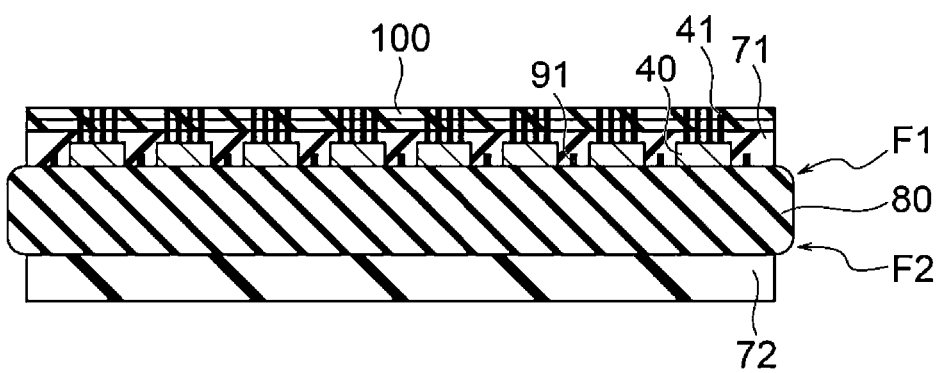

Next, as illustrated in FIG. 2F, a redistribution layer 100 that is electrically connected to the connection pillar 41 is formed or placed on the resin layer 71. For the insulating layer of the redistribution layer 100, for example, a resin, such as an epoxy-based resin, a phenol-based resin, a polyimide-based resin, a polyamide-based resin, an acrylic-based resin, a PBO-based resin, a silicone-based resin, or a benzocyclobutene-based resin, or a mixed or composite material of such resins can used. For the interconnection layer of the redistribution layer 100, copper (Cu), nickel (Ni), tungsten (W), gold (Au), silver (Ag), palladium (Pd), tin (Sn), bismuth (Bi), zinc (Zn), chromium (Cr), aluminum (Al), titanium (Ti), tantalum (Ta), titanium nitride (TiN), tantalum nitride (TaN), or chromium nitride (CrN), or a composite or alloy these materials may be used.

Figure 2G:
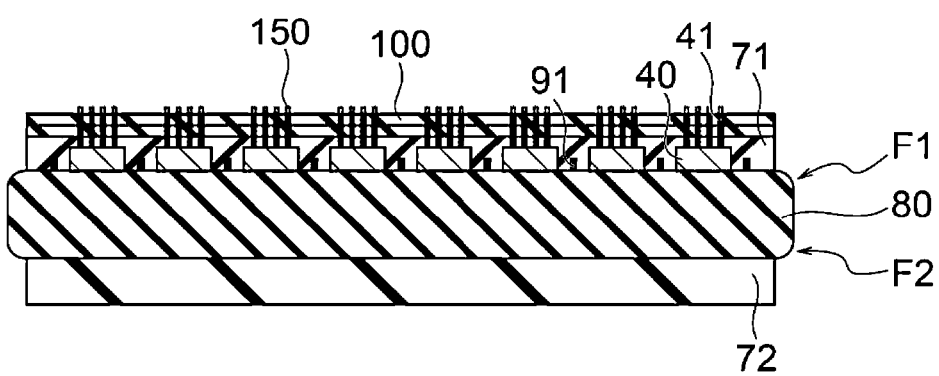

Next, as illustrated in FIG. 2G, the metal bump 150 is formed on the redistribution layer 100. The metal bump 150 is electrically connected to the connection pillar 41 via an interconnection of the redistribution layer 100. The metal bump 150 may be formed using, for example, ball mounting, a plating method, or a printing method. For the metal bump 150, such things as Sn, Ag, Cu, Au, Pd, Bi, Zn, Ni, Sb, In, or Ge, or composite or alloy of these may be used.

Figure 2H:
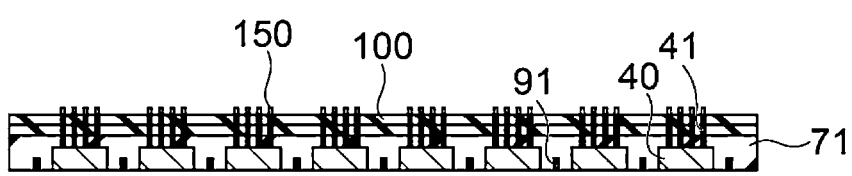

Next, as illustrated in FIG. 2H, the support 80 is peeled off together with the resin layer 72. The support 80 is peeled off using, for example, heat or light such as laser light. Alternatively, the support 80 and the resin layer 72 may be removed by polishing.

After the process illustrated in FIG. 2H, the resin layer 71 is singulated (diced/cut) for separation each semiconductor chip 40. With this, the semiconductor device 1 illustrated in FIG. 1 is completed. The singulated resin layer 71 corresponds to the resin layer 70 illustrated in FIG. 1.

In the example illustrated in FIG. 1, the mark 91 is removed during singulation. Alternatively, the mark 91 may remain on the semiconductor device 1 after singulation.

According to the first embodiment, the resin layer 71 is formed on the surface F1 and the resin layer 72 is formed on the surface F2. That is, the support 80 is sandwiched between the resin layers 71 and 72. With this configuration, the warpage when the semiconductor chip 40 is resin-sealed can be prevented. As a result, the processes after forming the resin layers 71 and 72, such as formation of the redistribution layer 100, can be performed more appropriately.

As a comparative example, a case where only the resin layer 71 is formed and the resin layer 72 is not provided will be described. In this case, due to the difference in the coefficient of linear thermal expansion (coefficient of thermal expansion) between the support 80 and the resin layer 71, the warpage of the support 80 is caused. When the warpage occurs in the support A with the resin layer, handling the support A with the resin layer thereon may become difficult. Furthermore, processing the support A with the resin layer, such as forming the redistribution layer 100 thereon, may become difficult.

In contrast, in the first embodiment, since the resin layer 72 is provided on the surface F2, a counteracting warpage in the direction opposite to the warpage caused by the resin layer 71 can be caused in the support A with the resin layer. With this, the warpage can be prevented or mitigated.

When viewed in the direction normal to the surface F2, forming the resin layer 72 in a region on the surface F2, which includes at least a region on the surface F1 on which the semiconductor chip 40 is provided, is generally preferable. With this configuration, the warpage can be prevented in the region on the surface F1 on which the semiconductor chip 40 is mounted.

Forming the resin layer 71 having a planar area equal to or larger than the area of the resin layer 72 is preferable. If the area of the resin layer 71 is small relative to the area of the resin layer 72, handling the resin layer 71 after the support 80 is peeled off may become difficult. Therefore, the area of the resin layer 71 is preferably larger than or equal to the area of the resin layer 72.

Forming a resin layer 71 having substantially the same planar area as the planar area of the support 80 is more preferable. With this configuration, an outer shape of the resin layer 71 after the support 80 is peeled off becomes substantially equal to an outer shape of the support 80. As a result, the resin layer 71 can be handled and conveyed in the same manner as the support 80.

Depending on the semiconductor chip 40 or the like disposed on the surface F1, completely preventing the warpage may be difficult even if the volumes and materials of the resin layers 71 and 72 are the same. This is because, for example, a balance of the coefficient of thermal expansion is lost between the resin layer 71, the semiconductor chip 40, and the resin layer 72. In this case, the resin layer 72 may be a different material than the resin layer 71. More specifically, the coefficient of thermal expansion, the shrinkage rate (molding shrinkage rate), and the like may be different between the material of the resin layer 72 and the material of the resin layer 71. By changing the materials of the resin layers 71 and 72, an amount of warpage can be adjusted. Therefore, the resin layer 72 having the coefficient of thermal expansion or the shrinkage rate at which the amount of warpage of the support A with the resin layer becomes equal to or less than a predetermined value may be formed. In this context, the amount of warpage is, for example, a difference in height between a central portion and an outer peripheral edge portion of the support A with the resin layer. The predetermined value is, for example, approximately 1 mm. The material for the resin layer 72 can be selected, for example, by simulation.

First Modification of First Embodiment

Figure 3:
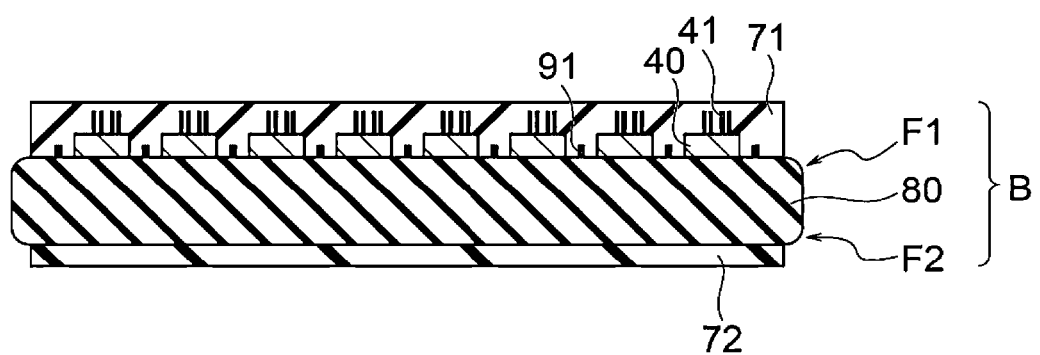
FIG. 3 is a cross-sectional view illustrating an example of a method for manufacturing a semiconductor device according to a first modification of the first embodiment.

FIG. 3 is a cross-sectional view illustrating an example of a method for manufacturing the semiconductor device 1 according to a first modification of the first embodiment. In the first modification of the first embodiment, the thickness of the resin layer 72 is different from that in the first embodiment.

The process illustrated in FIG. 3 is performed after the same processes as those in FIGS. 2A to 2C.

After forming the connection pillar 41 (see FIG. 2C), as illustrated in FIG. 3, the resin layer 71 is formed on the surface F1 and the resin layer 72 is formed on the surface F2.

In the example illustrated in FIG. 3, the resin layer 72 is formed to be thinner than the resin layer 71. The support 80 on which a resin layer 71 and a resin layer 72 that is thinner than the resin layer 71 have been formed is referred to as a support B with a resin layer. As described above, even if the volumes and materials of the resin layers 71 and 72 are the same, the balance of the coefficient of thermal expansion may be lost due to the semiconductor chip 40 or the like, and completely preventing the warpage may be difficult. Therefore, the resin layer 72 having a thickness that makes the amount of warpage equal to or less than a predetermined value may be formed. The predetermined value is, for example, approximately 1 mm. The appropriate thickness of the resin layer 72 is determined, for example, by simulation.

After the process illustrated in FIG. 3, the same processes as those in FIGS. 2E to 2H are performed.

As in the first modification of the first embodiment, the thickness of the resin layer 72 may be changed to adjust the warpage of the support B with the resin layer.

The resin layer 72 illustrated in FIG. 3 is thinner than the resin layer 71, but may be thicker than the resin layer 71 in other examples. The material of the resin layer 72 may also be different from the material of the resin layer 71.

The semiconductor device 1 according to the first modification of the first embodiment can obtain the same effect as that of the first embodiment.

Second Modification of First Embodiment

Figure 4:
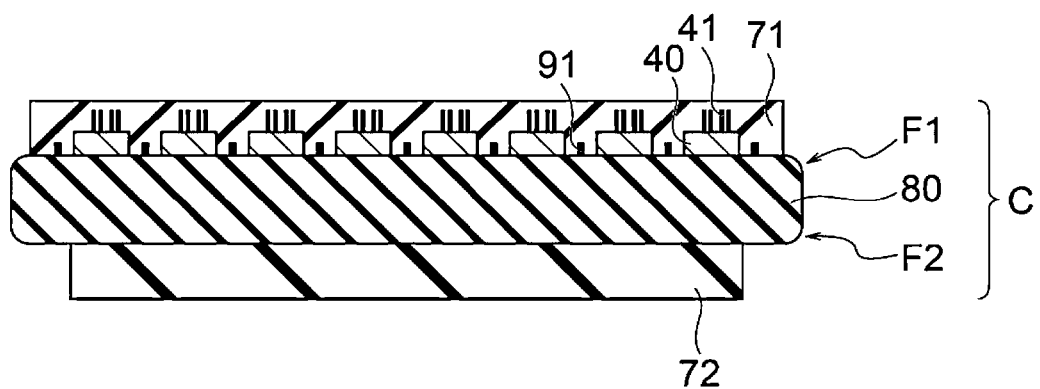
FIG. 4 is a cross-sectional view illustrating an example of a method for manufacturing a semiconductor device according to a second modification of the first embodiment.

FIG. 4 is a cross-sectional view illustrating an example of a method for manufacturing the semiconductor device 1 according to a second modification of the first embodiment. In the second modification of the first embodiment, the planar area of the resin layer 72 is different from that in the first embodiment.

The process illustrated in FIG. 4 is performed after the same processes as those in FIGS. 2A to 2C.

After forming the connection pillar 41 (see FIG. 2C), the resin layer 71 is formed on the surface F1 and the resin layer 72 is formed on the surface F2 as illustrated in FIG. 4.

In the example illustrated in FIG. 4, the resin layer 72 is formed in a narrower range than the resin layer 71. The support 80 on which a resin layer 71 and a resin layer 72 formed like in FIG. 4 is referred to as a support C with a resin layer. As described above, even if the volumes and materials of the resin layers 71 and 72 are the same, the balance of the coefficient of thermal expansion may be lost due to the semiconductor chip 40 or the like, and completely preventing the warpage may be difficult. Therefore, the resin layer 72 having an area that makes the amount of warpage equal to or less than a predetermined value may be formed. The predetermined value is, for example, approximately 1 mm. The area of the resin layer 72 can be determined, for example, by simulation.

After the process illustrated in FIG. 4, the same processes as those in FIGS. 2E to 2H are performed.

As in the second modification of the first embodiment, the area of the resin layer 72 may be changed in order to adjust the warpage.

The material of the resin layer 72 may also be different from the material of the resin layer 71.

The semiconductor device 1 according to the second modification of the first embodiment can obtain the same effect as that of the first embodiment. The semiconductor device 1 according to the second modification of the first embodiment may be combined with the first modification of the first embodiment.

Third Modification of First Embodiment

Figure 5A:
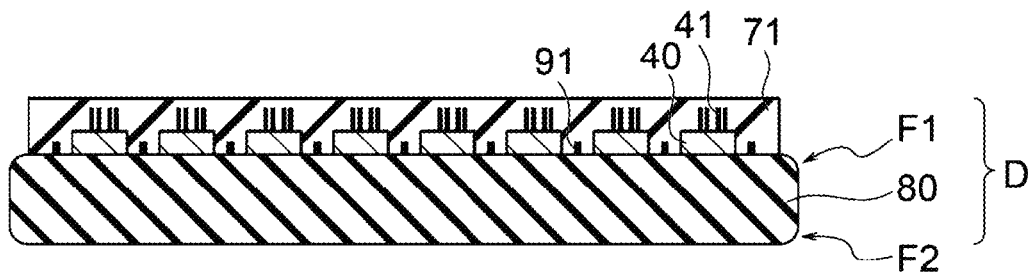
FIG. 5A and FIG. 5B are cross-sectional views illustrating aspects of a method for manufacturing a semiconductor device according to a third modification of the first embodiment.
Figure 5B:
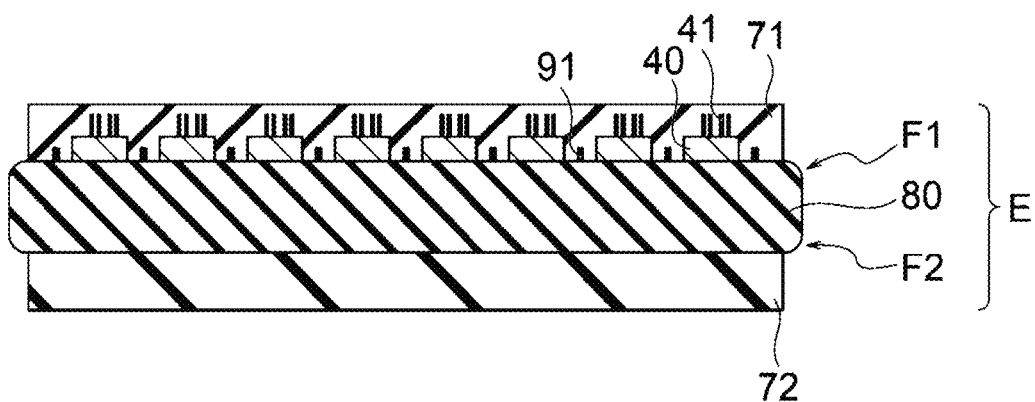

FIGS. 5A and 5B are cross-sectional views illustrating an example of a method for manufacturing the semiconductor device 1 according to a third modification of the first embodiment. The third modification of the first embodiment is different from the first embodiment in that one resin layer of two resin layers 71 and 72 may be formed on each side in order.

The processes illustrated in FIGS. 5A and 5B are performed after the same processes as those in FIGS. 2A to 2C.

After forming the connection pillar 41 (see FIG. 2C), the resin layer 71 is formed on the surface F1 as illustrated in FIG. 5A. The support 80 on which only the resin layer 71 is formed in this manner is referred to as a support D with a resin layer.

Next, as illustrated in FIG. 5B, the resin layer 72 is formed on the surface F2. The support 80 on which the resin layer 71 and the resin layer 72 are formed in this manner is referred to as a support E with a resin layer. That is, after the warpage is caused in the support D with the resin layer at the time of FIG. 5A, the resin layer 72 is then formed so that warp occurs in the opposite, offsetting direction.

Although the resin layer 72 may be formed first in some examples, forming the resin layer 71 first is generally preferable. This is because the electrode such as the connection pillar 41 can be protected first, which is preferable in terms of reliability. In a second embodiment, as will be described with reference to FIG. 7, a columnar electrode may be used as the electrode. Since a columnar electrode is more likely to fall than a connection pillar, protecting the columnar electrodes first with the resin layer 71 is preferable.

After the process illustrated in FIG. 5B, the same processes as those in FIGS. 2E to 2H are performed.

As in the third modification of the first embodiment, one of the two resin layers 71 and 72 may be formed first.

The support E with the resin layer 72 may be formed by first measuring the amount of warpage of the support D with the resin layer (after the formation of the resin layer 71) and then forming the resin layer 72 with a thickness, area, material type, or the like are adjusted or selected according to the measured amount of warpage.

The semiconductor device 1 according to the third modification of the first embodiment may be combined with the first modification and second modification of the first embodiment.

Fourth Modification of First Embodiment

Figure 6A:
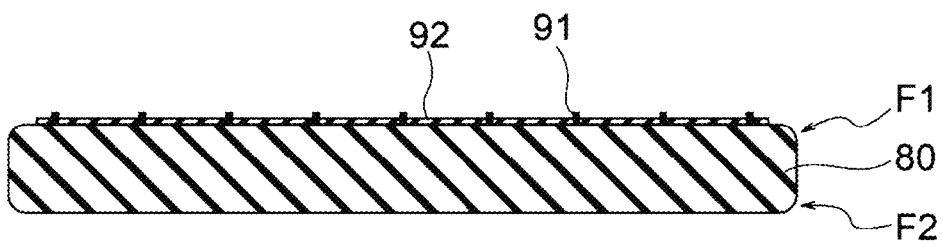
FIG. 6A and FIG. 6B are cross-sectional views illustrating aspects of a method for manufacturing a semiconductor device according to a fourth modification of the first embodiment.
Figure 6B:
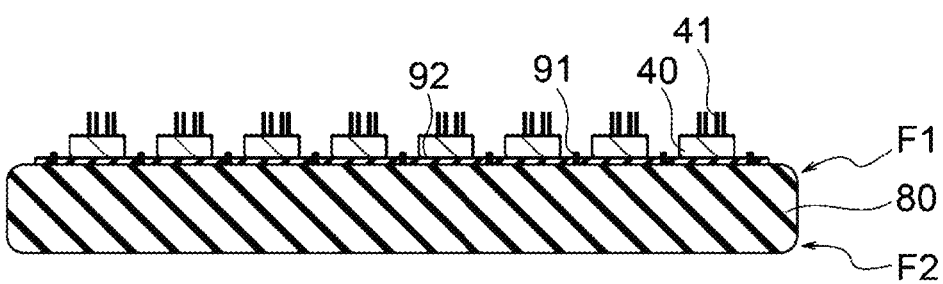

FIGS. 6A and 6B are cross-sectional views illustrating an example of a method for manufacturing the semiconductor device 1 according to a fourth modification of the first embodiment. The fourth modification of the first embodiment is different from the first embodiment in that an insulating film 92 is formed on the support 80.

The processes illustrated in FIGS. 6A and 6B are performed after that in FIG. 2A.

After preparing the support 80 (see FIG. 2A), the insulating film 92 is formed on the surface F1 as illustrated in FIG. 6A. The mark 91 is formed on the surface F1.

Next, as illustrated in FIG. 6B, the semiconductor chip 40 is provided on the insulating film 92. An electrode is formed on the semiconductor chip 40. The electrode is, for example, the connection pillar 41.

After the process illustrated in FIG. 6B, the same processes as those depicted in FIGS. 2D to 2H are performed.

When the insulating film 92 is provided, if the support 80 is peeled off, the insulating film 92 will be exposed. The insulating film 92 is in contact with the surface F40b of the semiconductor chip 40 via an adhesive layer or the like. With this configuration, any adverse effect due to the exposure of the adhesive layer (for example, die attachment film (DAF)) onto the package surface can be prevented.

The semiconductor device 1 according to the fourth modification of the first embodiment may be combined with the first modification, second modification, and/or the third modification of the first embodiment.

Second Embodiment

Figure 7:
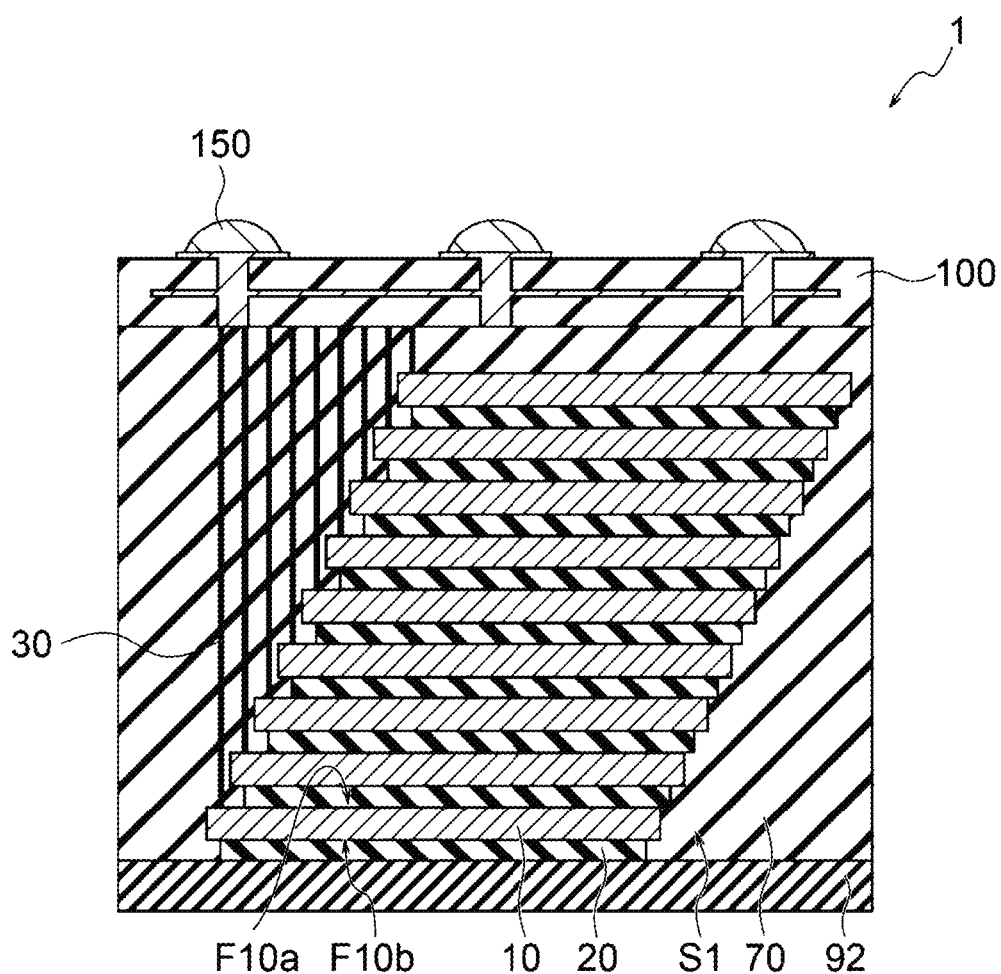
FIG. 7 is a cross-sectional view illustrating an example of a configuration of a semiconductor device according to a second embodiment.
Figure 7:
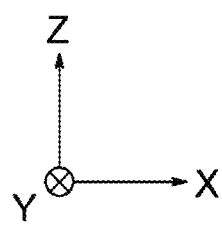

FIG. 7 is a cross-sectional view illustrating an example of a configuration of the semiconductor device 1 according to a second embodiment. The second embodiment is different from the first embodiment in that semiconductor chips are stacked in multiple stages and mounted on the support 80.

The semiconductor device 1 includes a stacked body S1, a columnar electrode 30, the resin layer 70, the insulating film 92, the redistribution layer 100, and the metal bump 150. The semiconductor device 1 is, for example, a semiconductor package such as a NAND flash memory.

In the second embodiment, the stacked body S1 and the columnar electrode 30 are provided instead of the semiconductor chip 40 and the connection pillar 41 according to the first embodiment. In the second embodiment, an insulating film 92 is provided in a manner similar to the fourth modification of the first embodiment (see FIG. 6A).

The stacked body S1 includes semiconductor chips 10 and adhesive layers 20. The adhesive layer 20 is, for example, a DAF. The semiconductor chips 10 are stacked offset from one another in a direction perpendicular to the stacking direction.

Each semiconductor chip 10 is, for example, a memory chip of a NAND flash memory type or any other semiconductor chip type, such as a semiconductor chip in which LSI elements are incorporated. Each of the semiconductor chips 10 has a surface F10a and a surface F10b opposite to the surface F10a. Semiconductor elements such as a memory cell array, transistors, and capacitors are formed on the surface F10a of each semiconductor chip 10. The semiconductor elements on the surface F10a of the semiconductor chip 10 are covered and protected with an insulating film. For this insulating film, an inorganic insulating material such as a silicon oxide film or a silicon nitride film can be used. In some examples, an organic insulating material formed on an inorganic insulating material may be used for this insulating film. As an organic insulating material in this use, a resin, such as a phenol-based resin, a polyimide-based resin, a polyamide-based resin, an acrylic-based resin, an epoxy-based resin, a p-phenylene benzobisoxazole resin (PBO-based resin), a silicone-based resin, or a benzocyclobutene-based resin, can be used. In some examples, the organic insulating material maybe a mixture or composite of the above resins. The semiconductor chips 10 may each have the same configuration as each other or may have different configurations from each other.

The semiconductor chips 10 are stacked on and adhered to adhesive layers 20. As the adhesive layer 20, an organic insulating material such as a phenol-based resin, a polyimide-based resin, a polyamide-based resin, an acrylic-based resin, an epoxy-based resin, a PBO-based resin, a silicone-based resin, or a benzocyclobutene-based resin, may be used. In some examples, the organic insulating material may be a mixture or a composite of the above resins. Each of the semiconductor chips 10 includes an electrode pad exposed on the surface F10a. Another semiconductor chip 10 (upper semiconductor chip 10) stacked on the semiconductor chip 10 (lower semiconductor chip 10) is offset in the X direction toward the side on which the electrode pad of the lower semiconductor chip 10 is not provided so the upper semiconductor chip 10 does not overlap the electrode pad of the lower semiconductor chip 10.

The columnar electrode (electrode) 30 is connected to the electrode pad of the semiconductor chip 10 and extends in the stacking direction (Z-direction) of the semiconductor chips 10. The adhesive layer 20 can be partially removed (or not provided) so as to leave a part of the electrode pad exposed, to permit the columnar electrode 30 to be connected to the electrode pad. In some examples, the adhesive layer 20 is attached to the surface F10b of the upper semiconductor chip 10 so as to not overlap the electrode pads of the lower semiconductor chip 10. The lower end of the columnar electrode 30 is connected to the electrode pad by, for example, a wire bonding method. The upper end of the columnar electrode 30 reaches the upper surface of the resin layer 70 and is exposed on the upper surface thereof. The upper end of the columnar electrode 30 is connected to an electrode pad of the redistribution layer 100.

The semiconductor chips 10 of the stacked body S1 are stacked in an offset manner to leave the electrode pads on each semiconductor chip 10 exposed for connection to the columnar electrodes 30 or the like.

The insulating film 92 is in contact with the surface F10b of the bottom semiconductor chip 10 illustrated in FIG. 7 via the adhesive layer 20. With this configuration, as described with reference to FIGS. 6A and 6B in the fourth modification of the first embodiment, any adverse effect due to the exposure of the adhesive layer 20 onto the package surface can be prevented. The insulating film 92 need not necessarily be provided in all examples.

Next, a method for manufacturing the semiconductor device 1 of the second embodiment will be described.

Figure 8:
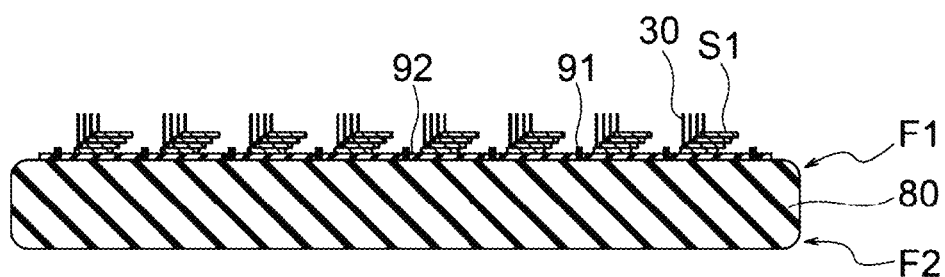
FIG. 8 is a cross-sectional view illustrating aspects related to a method for manufacturing a semiconductor device according to the second embodiment.

FIG. 8 is a cross-sectional view illustrating aspects of the method for manufacturing the semiconductor device 1 according to the second embodiment.

The process illustrated in FIG. 8 is performed after the processes in FIG. 2A or FIG. 6A.

After forming the insulating film 92 on the surface F1 (see FIG. 6A), as illustrated in FIG. 8, the stacked body S1 is provided on the insulating film 92 (surface F1). An electrode is on the semiconductor chips 10. The electrode is, for example, a columnar electrode 30. A metal wire (conductive wire) is bonded onto the electrode pad of the semiconductor chip 10 by a wire bonding method, and the metal wire is lead out in a direction substantially perpendicular to the surface F10a to form the columnar electrode 30. The columnar electrode 30 is cut at the upper end, and maintains an upright state due to rigidity of the columnar electrode 30 itself.

For the columnar electrode 30, Cu, Ni, W, Au, Ag, Pd, Sn, Bi, Zn, Cr, Al, Ti, or Ta, or a composite or an alloy these can be. Preferably, as the material of the columnar electrode 30, either Au, Ag, Cu, or Pd, or a composite or an alloy of these is used. More preferably, a material having relatively high hardness such as Cu, a CuPd alloy, or a composite material obtained by coating Pd on Cu is used for the columnar electrode 30. With such material, the columnar electrode 30 becomes harder to bend and less likely to collapse or break when covered with the resin layer 70.

After the process illustrated in FIG. 8, substantially the same processes as in FIGS. 2D to 2H are performed.

In the second embodiment, a part of the support 80 may be used instead of the insulating film 92 depicted in FIG. 7. For example, instead of the process of peeling off from the support 80, the support 80 may be ground (polished) from the surface F2 side until the support 80 reaches a predetermined thickness. The thinned support 80, now similar to the insulating film 92, can serve to prevent any adverse effect that might otherwise be due to the exposure of the adhesive layer 20 to the package surface.

The semiconductor device 1 according to the second embodiment can obtain substantially the same effects as that of the first embodiment.

Third Embodiment

FIGS. 9A to 9E are cross-sectional views illustrating an example of a method for manufacturing the semiconductor device 1 according to a third embodiment. The third embodiment is different from the second embodiment in that a recess portion 81 is formed on the surface F2.

The processes illustrated in FIGS. 9A to 9E are performed after the processes in FIG. 2A or 6A.

Figure 9A:
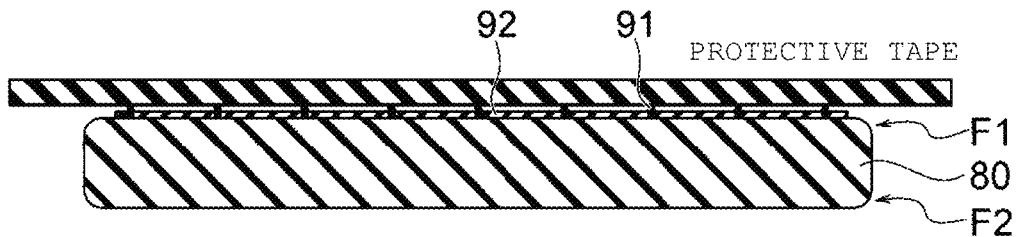
FIG. 9A to FIG. 9E are cross-sectional views illustrating aspects of a method for manufacturing a semiconductor device according to a third embodiment.

After forming the insulating film 92 on the surface F1 (see FIG. 6A), a protective tape is attached on the insulating film 92 (surface F1) as illustrated in FIG. 9A.

Figure 9B:
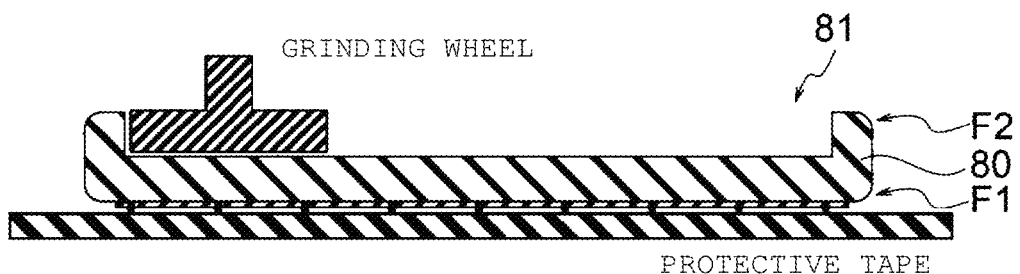

Next, as illustrated in FIG. 9B, the recess portion 81 is formed on the surface F2 of the support 80. The recess portion 81 is formed using, for example, a grinding wheel. The recess portion 81 may be formed instead by wet etching. The material of the support 80 may be any material into which the recess portion 81 can be formed.

Figure 10:
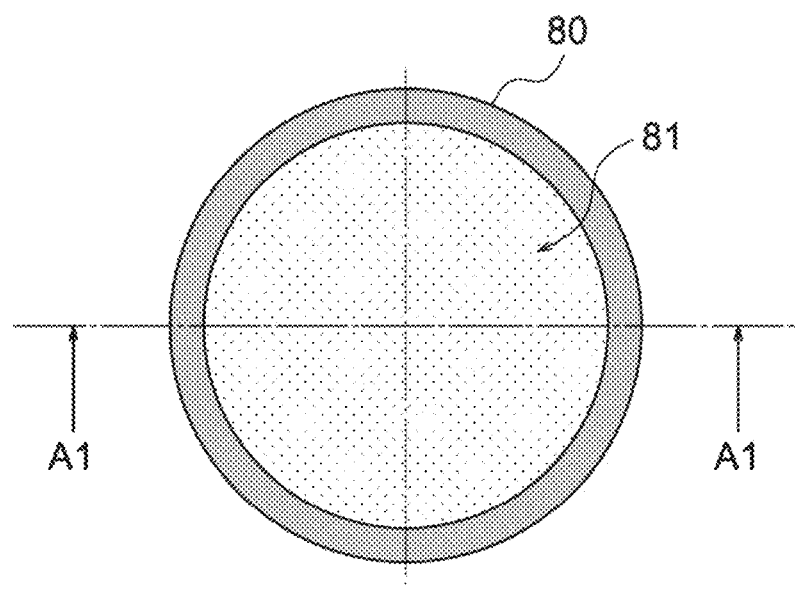
FIG. 10 is a plan view illustrating an example of a configuration of a recess portion according to the third embodiment.

FIG. 10 is a plan view illustrating an example of the configuration of the recess portion 81 according to the third embodiment. FIG. 10 is a top view of the surface F2 when viewed from above in FIG. 9B. Line A1-A1 in FIG. 10 illustrates a cross section corresponding to FIG. 9B, which is a cross-sectional view.

In the example illustrated in FIG. 10, the support 80 is a disk-shaped plate. An outer peripheral shape of the support 80 when viewed from the normal line direction of the surface F2 is, for example, substantially circular.

The recess portion 81 when viewed from the normal line direction of the surface F2 is formed in a substantially circular shape at the central portion of the surface F2, for example. The shape of the recess portion 81 may be changed according to, for example, the outer peripheral shape of the support 80.

Figure 9C:
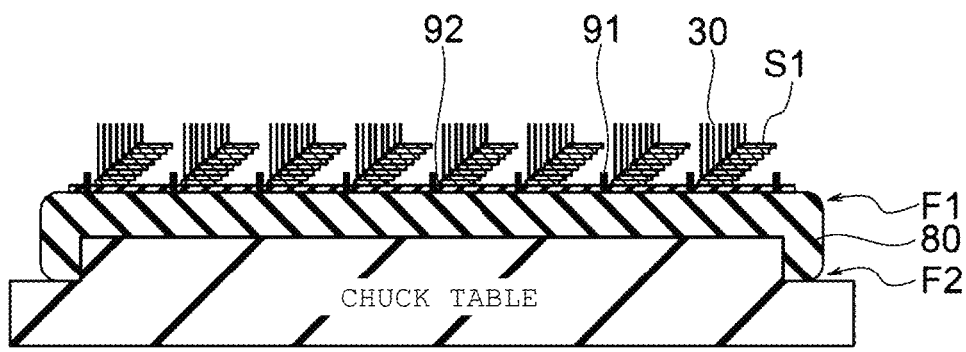

Next, as illustrated in FIG. 9C, the protective tape is peeled off. The stacked body S1 is provided on the insulating film 92. An electrode is formed on the semiconductor chips 10. The electrode is, for example, the columnar electrode 30. The support 80 is supported by, for example, a chuck table. The chuck table includes, for example, a protruding portion corresponding to (e.g., matching or mating with) the recess portion 81 of the support 80.

Figure 9D:
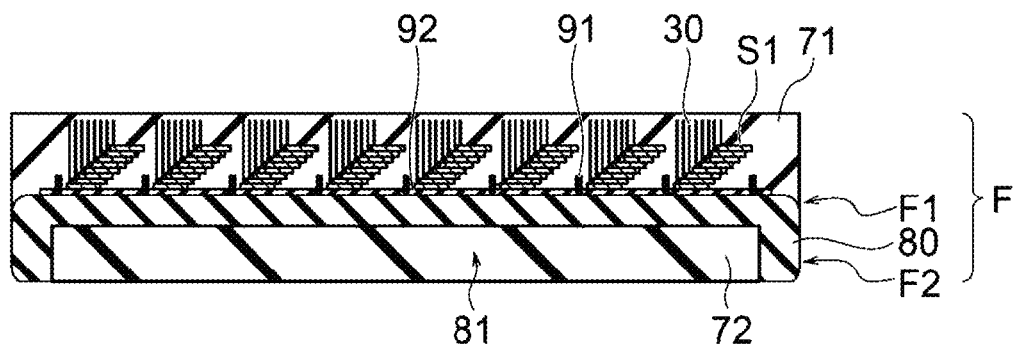

Next, as illustrated in FIG. 9D, the resin layer 71 covering the stacked body S1 and the columnar electrodes 30 is formed on the surface F1, and the resin layer 72 is formed on the surface F2. The support 80 on which the resin layers 71 and 72 are formed, and which includes the recess portion 81, is referred to as a support F with a resin layer. More specifically, the resin layer 72 is formed in the recess portion 81 on the surface F2. In the example illustrated in FIG. 9D, the resin layer 72 is formed in the recess portion 81 to be substantially flush with the surface F2. With this configuration, the combined thickness of the support 80 and the resin layer 72 can be substantially the same as the thickness of the support 80 before forming the recess portion 81. As a result, the resin layer 72 can be formed on the surface F2 side of the support 80 without significantly increasing the thickness of the support 80.

Figure 9E:
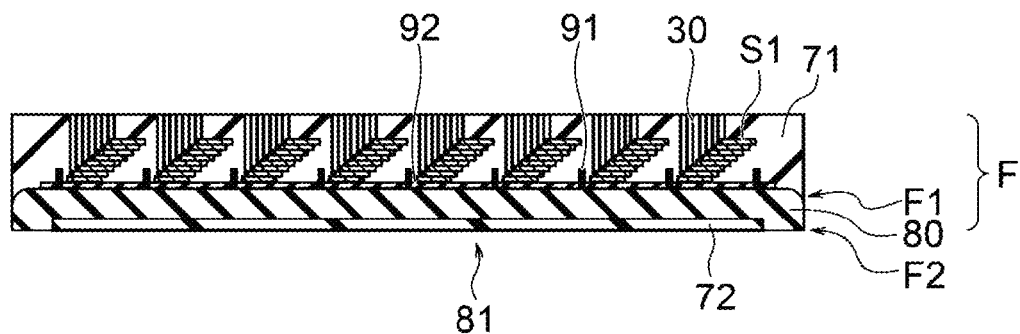

Next, as illustrated in FIG. 9E, the resin layer 71 is polished so that the columnar electrode 30 is exposed. The resin layer 72 is polished according to the amount of polishing of the resin layer 71. That is, the support 80 and the resin layer 72 in the recess portion 81 are also polished from the surface F2 side. When the resin layer 71 is polished to expose the electrode, a warped state of the support F with the resin layer may change. By polishing the resin layer 72, the warpage can be adjusted so as to reverse or counteract the changed state of warpage.

After the process illustrated in FIG. 9E, the substantially same processes as those in FIGS. 2F to 2H are performed.

In FIG. 2D as described for the first embodiment, the recess portion 81 is not provided, and the resin layer 72 is provided on the surface F2 of the support 80. This leads to an increase in the combined thickness of the support 80 and the resin layer 72. Formation of the resin layer 72 as in FIG. 2D also increases an overall weight of the support with the resin layer. An increase in the combined thickness or overall weight may adversely affect conveyance or handling of the support.

In contrast, in the third embodiment, in FIG. 9D, the combined thickness of the support 80 and the resin layer 72 is substantially the same as the thickness of the support 80 alone. By forming the recess portion 81, the total weight of the support 80 can be reduced. Therefore, the warpage can be prevented while preventing adverse influence on the handling of the support with the resin layer.

When viewed from the normal line direction of the surface F2, forming the recess portion 81 in the region on the surface F2 including at least the region on the surface F1 on which the semiconductor chip 10 (stacked body S1) is provided is more preferable. The resin layer 72 is formed in the recess portion 81. With this configuration, the warpage can be prevented in the region of the surface F1 on which the semiconductor chip 10 is mounted.

The semiconductor device 1 according to the third embodiment can obtain the same effect as that of the second embodiment. The semiconductor device 1 according to the third embodiment may be combined with the first embodiment.

First Modification of Third Embodiment

Figure 11:
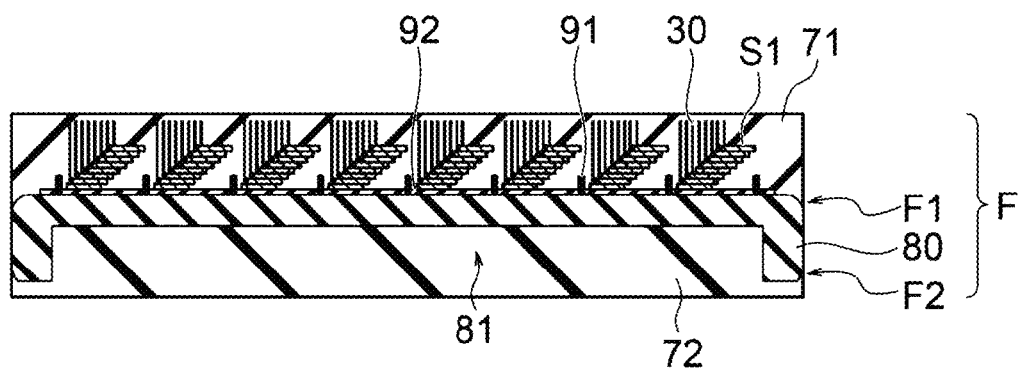
FIG. 11 is a cross-sectional view illustrating an example of a method for manufacturing a semiconductor device according to a first modification of the third embodiment.
Figure 12:
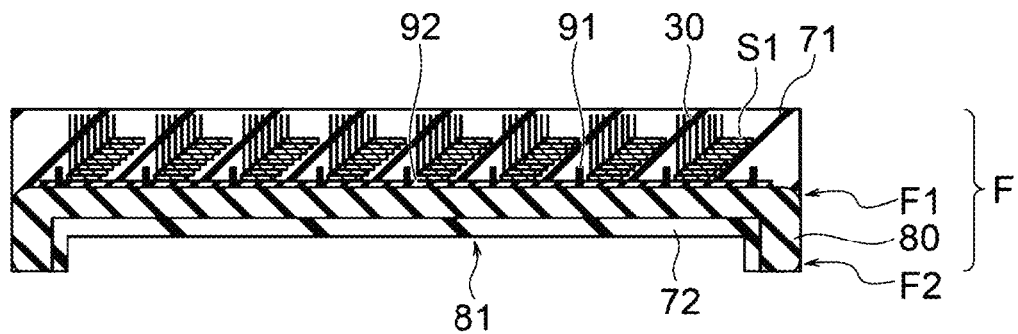
FIG. 12 is a cross-sectional view illustrating another example of the method for manufacturing the semiconductor device according to a first modification of the third embodiment.

FIGS. 11 and 12 are cross-sectional views illustrating aspects of a method for manufacturing the semiconductor device 1 according to a first modification of the third embodiment. The first modification of the third embodiment is different from the third embodiment in that the resin layer 72 is not flush with the surface F2.

As described with reference to FIG. 3 in the first modification of the first embodiment, the thickness of the resin layer 72 may be changed in order to adjust the warpage.

The process illustrated in FIG. 11 is performed after the processes in FIGS. 2A, 6A, and 9A to 9C.

After forming the columnar electrode 30 (see FIG. 9C), the resin layer 71 is formed on the surface F1 and the resin layer 72 is formed on the surface F2 as illustrated in FIG. 11.

In the example illustrated in FIG. 11, the resin layer 72 is formed from the bottom surface of the recess portion 81 to a height exceeding the surface F2.

After the process illustrated in FIG. 11, the same processes as those in FIG. 9E and FIGS. 2F to 2H are performed.

Instead of the process illustrated in FIG. 11, the process illustrated in FIG. 12 may be performed in some examples.

In the example illustrated in FIG. 12, the resin layer 72 is formed from the bottom surface of the recess portion 81 to a height not exceeding the surface F2. Therefore, the recess portion 81 is not completely filled with the resin layer 72.

As in the first modification of the third embodiment, the thickness of the resin layer 72 may be changed in order to adjust the warpage.

The semiconductor device 1 according to the first modification of the third embodiment can obtain the same effect as that of the third embodiment. The semiconductor device 1 according to the first modification of the third embodiment may be combined with the first embodiment.

Second Modification of Third Embodiment

Figure 13:
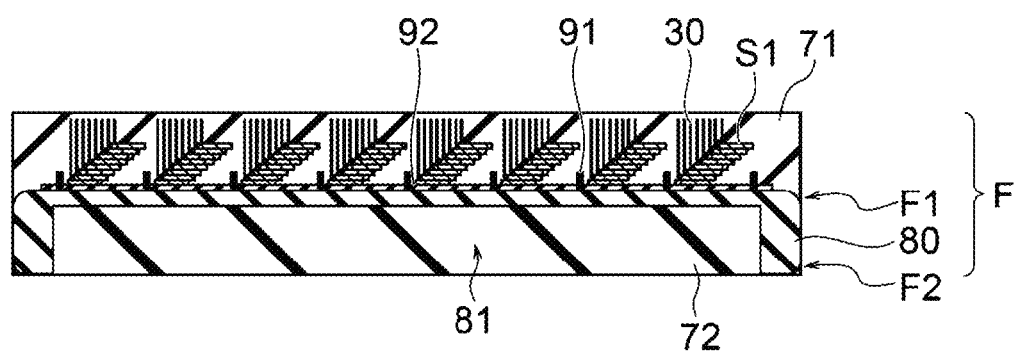
FIG. 13 is a cross-sectional view illustrating an example of a method for manufacturing a semiconductor device according to a second modification of the third embodiment.
Figure 14:
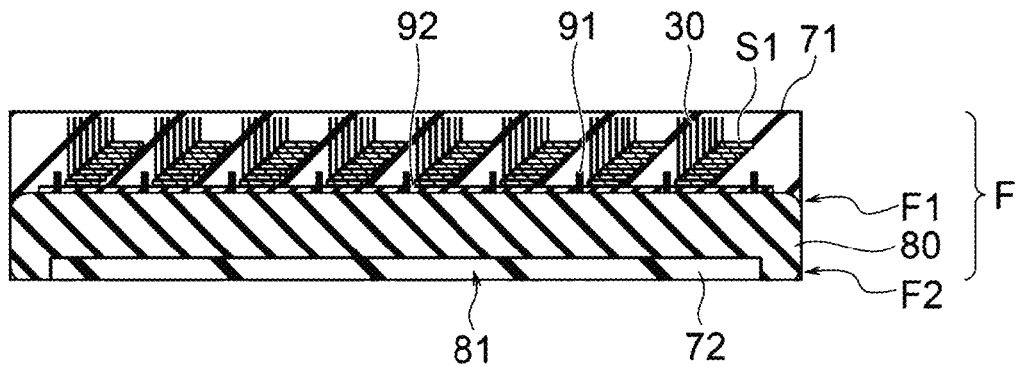
FIG. 14 is a cross-sectional view illustrating another example of the method for manufacturing the semiconductor device according to a second modification of the third embodiment.

FIGS. 13 and 14 are cross-sectional views illustrating a method for manufacturing the semiconductor device 1 according to a second modification of the third embodiment. In the second modification of the third embodiment, the depth of the recess portion 81 is different from that in the third embodiment.

The process illustrated in FIG. 13 is performed after the processes as those in FIG. 2A, FIG. 6A, and FIGS. 9A to 9C.

After forming the columnar electrode 30 (see FIG. 9C), the resin layer 71 is formed on the surface F1 and the resin layer 72 is formed on the surface F2 as illustrated in FIG. 13. The resin layer 72 is formed substantially flush with the surface F2.

In FIG. 13, the resin layer 72 is thicker than that in FIG. 9D is formed. That is, by reducing the remaining thickness of the support 80, the thick resin layer 72 can be formed in the recess portion 81. With this configuration, the warpage due to the adjustment of the thickness of the resin layer 72 can be adjusted while preventing thickening of the support F with the resin layer by the thick resin layer 72 compared to in FIG. 11 in the first modification of the third embodiment.

After the process illustrated in FIG. 13, the same processes as those in FIG. 9E and FIGS. 2F to 2H are performed.

Instead of the process illustrated in FIG. 13, the process illustrated in FIG. 14 may be performed.

In FIG. 14, a resin layer 72 thinner than that in FIG. 9D is formed. That is, by increasing the remaining thickness of the support 80, a thin resin layer 72 can be formed in the recess portion 81. With this configuration, the warpage due to the adjustment of the thickness of the resin layer 72 can be adjusted while preventing thinning of the support 80 by the thin resin layer 72 compared to in FIG. 12 described in the first modification of the third embodiment.

When the resin layer 72 is formed substantially flush with the surface F2 as in the second modification of the third embodiment, the depth of the recess portion 81 may be changed in consideration of the warpage, that is, the thickness of the resin layer 72 to be formed.

The semiconductor device 1 according to the second modification of the third embodiment can obtain the same effect as that of the third embodiment. The semiconductor device 1 according to the second modification of the third embodiment may be combined with the first embodiment.

Fourth Embodiment

Figure 15A:
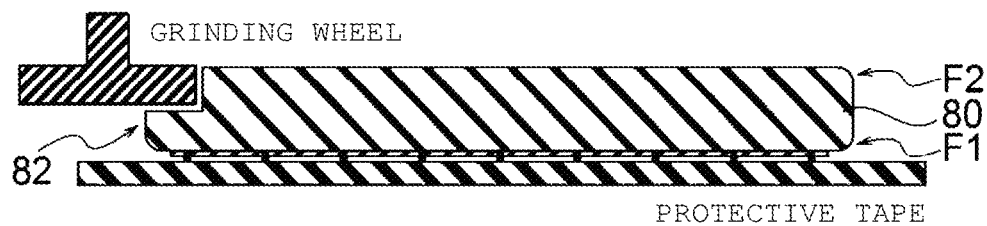
FIG. 15A and FIG. 15B are cross-sectional views illustrating aspects of a method for manufacturing a semiconductor device according to a fourth embodiment.
Figure 15B:
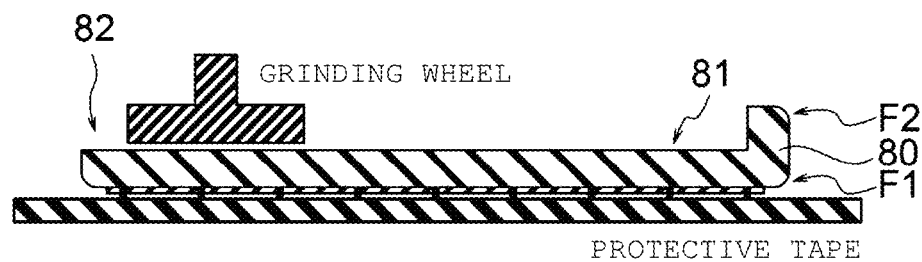

FIGS. 15A and 15B are cross-sectional views illustrating an example of a method for manufacturing the semiconductor device 1 according to a fourth embodiment. The fourth embodiment is different from the third embodiment in that a groove portion 82 that functions as a filling port for the resin material is formed.

The processes illustrated in FIGS. 15A and 15B are performed after those in FIGS. 2A, 6A, and 9A.

After attaching the protective tape on the insulating film 92 (see FIG. 9A), the groove portion 82 is formed as illustrated in FIG. 15A. The groove portion 82 functions as a filling port for introducing the resin material into the recess portion 81 when forming the resin layer 72. The groove portion 82 is formed, for example, by cutting a part of the outer peripheral end portion of the surface F2. The groove portion 82 can be formed by a grinding wheel in a similar manner as the recess portion 81. The groove portion 82 may be formed by, for example, wet etching.

The groove portion 82 functions as a filling port for the resin material. The configuration of the groove portion 82 will be described later with reference to FIGS. 16 and 17.

As illustrated in FIG. 15B, the recess portion 81 is formed.

Figure 16:
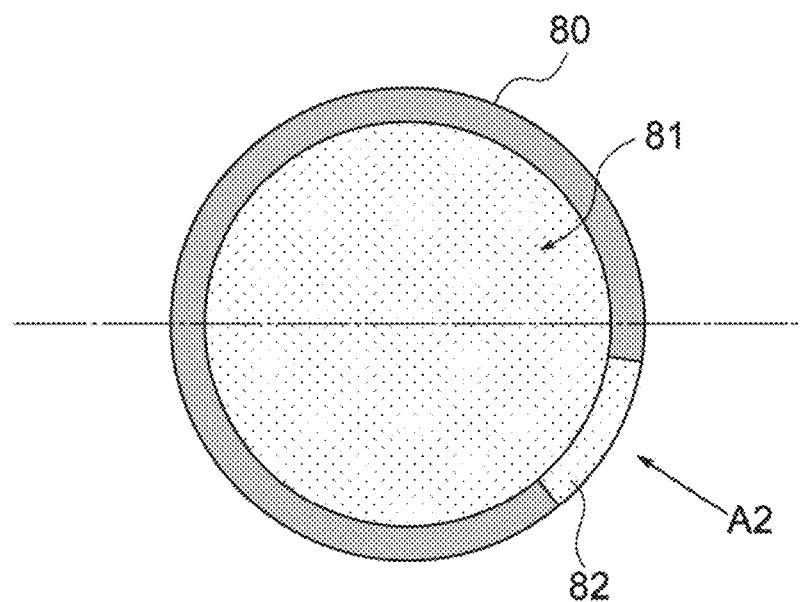
FIG. 16 is a plan view illustrating an example of a configuration of a recess portion and a groove portion according to a fourth embodiment.
Figure 17:
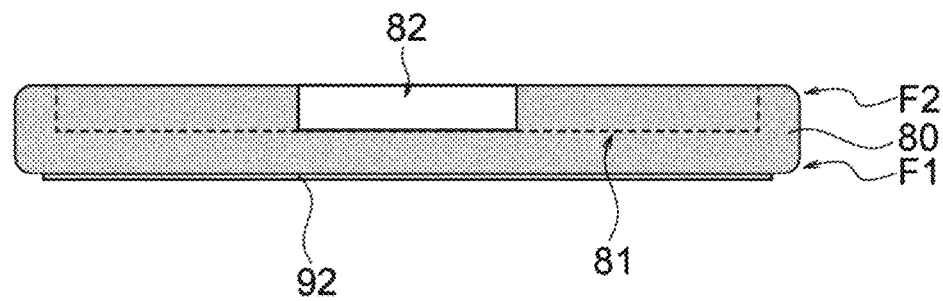
FIG. 17 is a side view illustrating an example of the configuration of a recess portion and a groove portion according to a fourth embodiment.

FIG. 16 is a plan view illustrating an example of the configuration of the recess portion 81 and the groove portion 82 according to the fourth embodiment. FIG. 17 is a side view illustrating an example of the configuration of the recess portion 81 and the groove portion 82 according to the fourth embodiment. FIG. 17 is a side view when viewed from a direction of arrow A2 illustrated in FIG. 16.

As illustrated in FIG. 16, the recess portion 81 is not formed at the outer peripheral edge portion of the surface F2. As illustrated in FIGS. 16 and 17, the groove portion 82 is provided in a part of the outer peripheral portion of the surface F2. The groove portion 82 is formed, for example, from the surface F2 to a depth substantially the same as that of the recess portion 81. The groove portion 82 is formed, for example, from the outer peripheral side surface of the support 80 to the inner peripheral side surface of the recess portion 81.

That is, as illustrated in FIGS. 15A and 15B, the recess portion 81 is formed on the surface F2, and at least one groove portion 82 provided from the outer peripheral side surface of the support 80 to the inner peripheral side surface of the recess portion 81 is formed on the surface F2. In the examples illustrated in FIGS. 15A and 15B, the recess portion 81 is formed after the groove portion 82 is formed. However, either the recess portion 81 or the groove portion 82 may be formed first. The recess portion 81 and the groove portion 82 may be formed in parallel at the same time.

After the process illustrated in FIG. 15B, the same processes as those in FIGS. 9C to 9E and FIGS. 2F to 2H are performed.

In FIG. 9D, the resin layer 72 is formed inside the recess portion 81 by introducing a resin material into the recess portion 81. The resin material passes through the groove portion 82.

Next, a method for forming the resin layers 71 and 72 using the groove portion 82 will be described.

Figure 18:
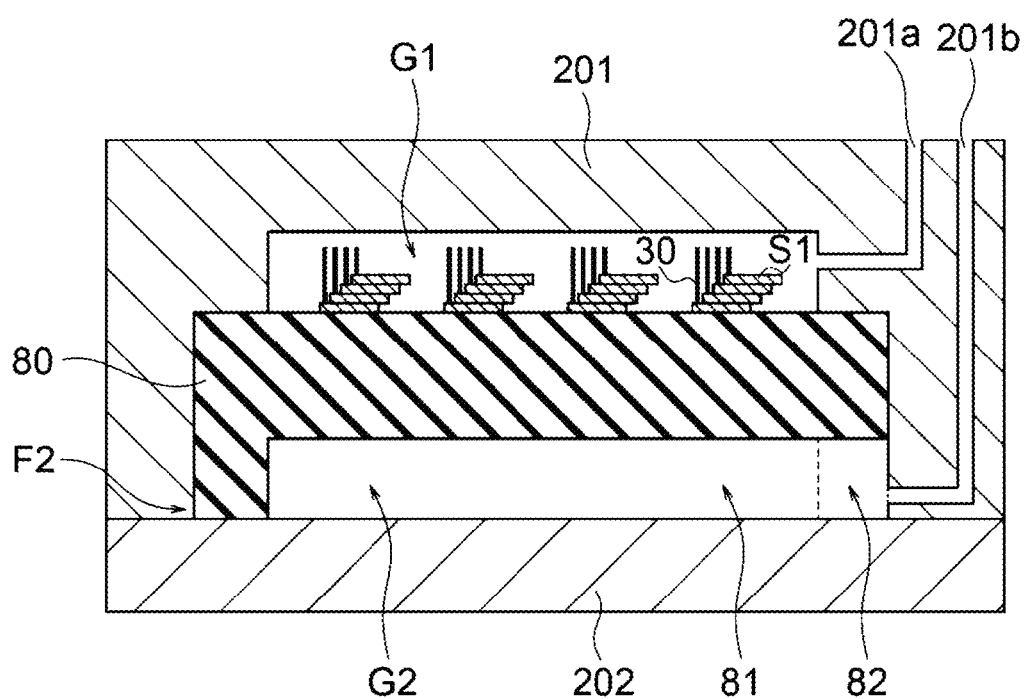
FIG. 18 is a cross-sectional view illustrating an example of a method for forming a resin layer according to a fourth embodiment.

FIG. 18 is a cross-sectional view illustrating an example of the method for forming the resin layers 71 and 72 according to the fourth embodiment.

As illustrated in FIG. 18, the support 80, the stacked body S1, and the columnar electrode 30 are disposed in the cavities of molds 201 and 202. A gap G1 is left between the upper mold 201 and the support 80. A gap G2 is left between the lower mold 202 and the support 80.

Next, the resin material is introduced into the gaps G1 and G2 from two passages 201a and 201b of the mold 201, respectively. The mold 201 may be additionally provided with an exhaust port. The resin material passes through the passage 201a and is filled in the gap G1 to form the resin layer 71. The resin material passes through the passage 201b and is filled in the gap G2 to form the resin layer 72. Since the mold 201 has two passages 201a and 201b, the resin layers 71 and 72 can be formed of different materials.

Here, the resin material filled in the gap G2 passes through the groove portion 82 and is introduced into the recess portion 81. With this configuration, the resin material can be introduced from the side surface side of the support 80 to form the resin layer 72, and the resin layer 72 can be formed substantially flush with the surface F2.

As a method for introducing the resin material into the recess portion 81, the resin material can be introduced from below the support 80 and/or can be introduced from the side surface side of the support 80.

When a groove portion 82 is not provided, the periphery of the recess portion 81 is covered with the protruding portion of the side wall of the recess portion 81, as illustrated in FIGS. 9B and 10. In this case, introducing the resin material from the side surface side of the support 80 becomes difficult. For example, introducing the resin material from the side of the gap G2 by using the molds 201 and 202 in which the gap G2 is widened below the support 80 as compared with FIG. 18 can be considered. That is, the thick resin layer 72 exceeds the surface F2. However, in this case, since the support 80 becomes thick, the conveyance of the support 80 may be affected. Forming a thin resin layer 72 may become difficult.

Therefore, by forming the groove portion 82, the resin layer 72 can be formed in the recess portion 81 so as to be substantially flush with the surface F2. As a result, even when the resin material is introduced from the side surface side of the support 80, thickening of the support 80 can be prevented.

The semiconductor device 1 according to the fourth embodiment can obtain the same effect as that of the third embodiment. The semiconductor device 1 according to the fourth embodiment may be combined with the first embodiment.

First Modification of Fourth Embodiment

Figure 19:
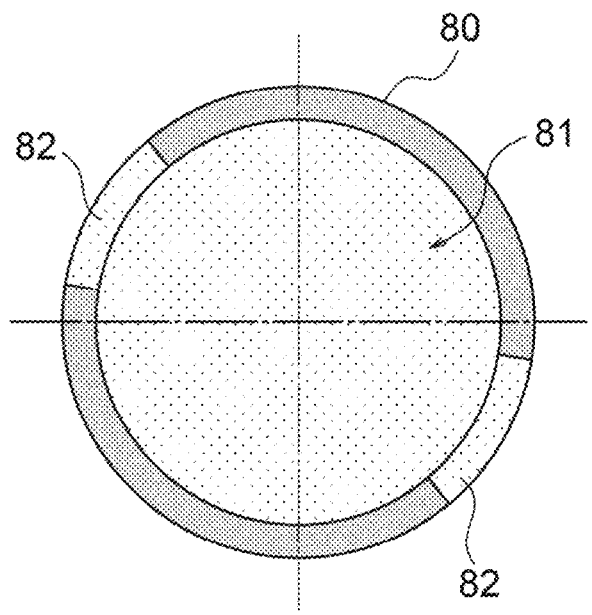
FIG. 19 is a plan view illustrating an example of a configuration of a recess portion and a groove portion according to a first modification of the fourth embodiment.
Figure 20:
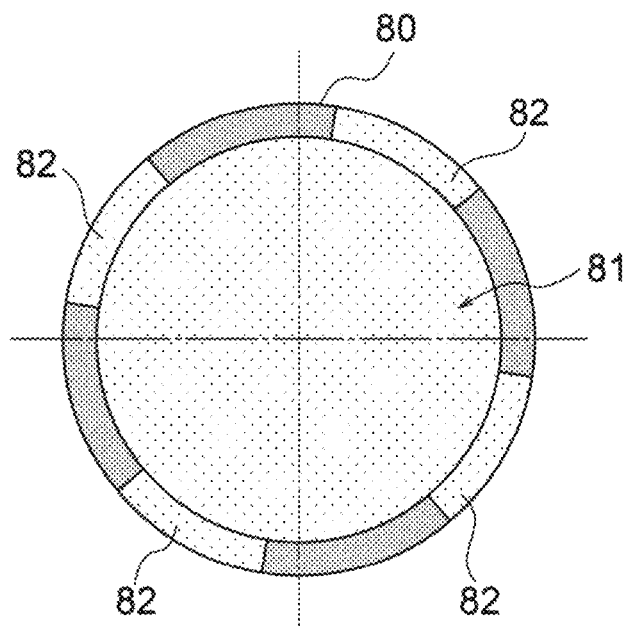
FIG. 20 is a plan view illustrating an example of the configuration of a recess portion and a groove portion according to a first modification of the fourth embodiment.

FIGS. 19 and 20 are plan views illustrating an example of the configuration of the recess portion 81 and the groove portion 82 according to a first modification of the fourth embodiment. In the first modification of the fourth embodiment, the number of groove portions 82 is increased.

In the example illustrated in FIG. 19, two groove portions 82 are provided. The two groove portions 82 are disposed on opposite sides with the center of the support 80 interposed in between, for example. By increasing the number of groove portions 82, the resin material can be filled more appropriately.

In the example illustrated in FIG. 20, four groove portions 82 are provided.

That is, a plurality of groove portions 82 may be formed.

The semiconductor device 1 according to the first modification of the fourth embodiment can obtain the same effect as that of the fourth embodiment.

Second Modification of Fourth Embodiment

Figure 21:
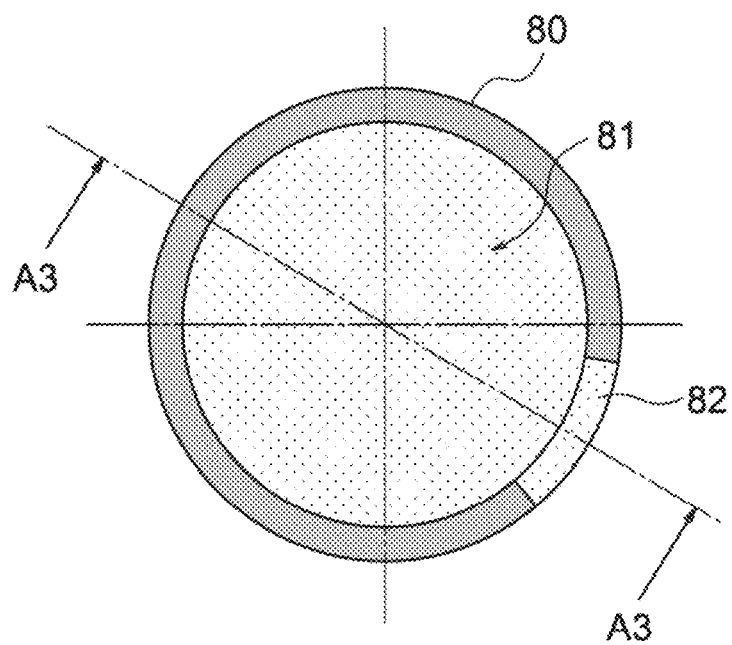
FIG. 21 is a plan view illustrating an example of a configuration of a recess portion and a groove portion according to a second modification of the fourth embodiment.
Figure 22:
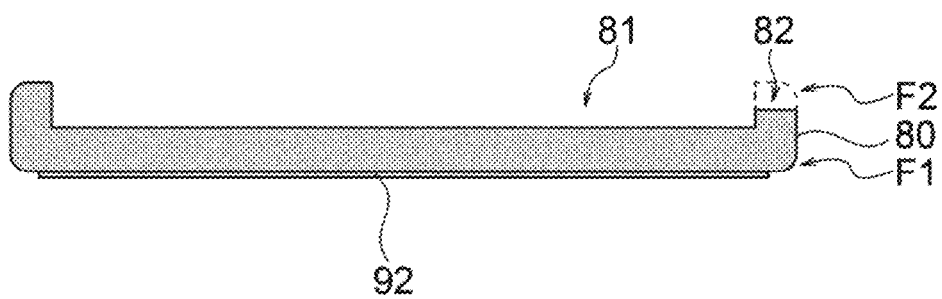
FIG. 22 is a cross-sectional view illustrating another example of the configuration of a recess portion and a groove portion according to a second modification of the fourth embodiment.

FIG. 21 is a plan view illustrating an example of the configuration of the recess portion 81 and the groove portion 82 according to a second modification of the fourth embodiment. FIG. 22 is a cross-sectional view illustrating the configuration of the recess portion 81 and the groove portion 82 according to the second modification of the fourth embodiment. Line A3-A3 in FIG. 21 illustrates a cross section corresponding to FIG. 22. In the second modification of the fourth embodiment, the depth of the groove portion 82 is different from that of the fourth embodiment.

In FIG. 22, the groove portion 82 is shallower than the recess portion 81.

Thus, the depth of the groove portion 82 may be changed within a range still permitting the resin material to pass.

The semiconductor device 1 according to the second modification of the fourth embodiment can obtain the same effect as that of the fourth embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A method for manufacturing a semiconductor device, the method comprising:
   adhering a semiconductor chip on to a first surface of a support substrate using an adhesive between the semiconductor chip and the first surface of the support substrate;
   forming a first resin layer covering the semiconductor chip on the first surface;
   after adhering the semiconductor chip, forming a second resin layer on a second surface of the support substrate without detaching the semiconductor chip from the first surface of the support substrate, the second surface being opposite the first surface;

forming an electrode on the semiconductor chip after the semiconductor chip has been placed on the support substrate, the electrode extending in a direction substantially orthogonal to the first surface;

polishing the first resin layer to expose an upper end of the electrode; and polishing the second resin layer to a thickness selected according to an amount of polishing of the first resin layer required to expose the upper end of the electrode, wherein the first resin layer is formed after the electrode is formed, and the first resin layer covers the electrode.

2. The method according to claim 1, wherein
the first resin layer and the second resin layer have substantially the same thickness.

3. The method according to claim 1, wherein the first resin layer and the second resin layer have substantially the same planar shape and size when viewed from a direction orthogonal to the first surface.

4. The method according to claim 1, wherein the first resin layer and the second resin layer are formed at the same time in a molding process.

5. The method according to claim 1, wherein the first resin layer and the second resin layer are formed at the same time.

6. The method according to claim 1, wherein the first resin layer is formed before the second resin layer is formed.

7. The method according to claim 1, further comprising:
forming a recess portion in the second surface of the support substrate before forming the second resin layer, wherein the second resin layer is formed in the recess portion.

8. The method according to claim 7, wherein the recess portion includes a groove portion connecting an interior of the recess portion to an exterior of the recess portion.

9. The method according to claim 7, further comprising:
forming a groove portion connecting an interior of the recess portion to an exterior of the recess portion, wherein resin material of the second resin layer passes through the groove portion from the exterior of the recess portion to the interior of the recess portion.

10. The method according to claim 7, wherein the depth of the recess portion matches the thickness of the second resin layer.

11. The method according to claim 7, wherein the thickness of the second resin layer is greater than the depth of the recess portion.

12. The method according to claim 1, wherein the first resin layer completely overlaps the second resin layer when viewed from a direction orthogonal to the first surface.

13. The method according to claim 1, wherein a material of the second resin layer is different from a material of the first resin layer.

14. A method for manufacturing a semiconductor device, the method comprising:
adhering a semiconductor chip on to a first surface of a support substrate using an adhesive between the semiconductor chip and the first surface of the support substrate;

forming a first resin layer covering the semiconductor chip on the first surface;

after adhering the semiconductor chip, forming a second resin layer on a second surface of the support substrate without detaching the semiconductor chip from the first surface of the support substrate, the second surface being opposite the first surface;

separating the support substrate and the second resin layer from the first resin layer; and cutting the first resin layer to form a singulated semiconductor chip.

15. The method according to claim 14, wherein
the first resin layer and the second resin layer have substantially the same thickness.

16. The method according to claim 14, wherein the first resin layer and the second resin layer have substantially the same planar shape and size when viewed from a direction orthogonal to the first surface.

17. The method according to claim 14, wherein the first resin layer and the second resin layer are formed at the same time in a molding process.

18. The method according to claim 14, wherein the first resin layer and the second resin layer are formed at the same time.

19. The method according to claim 14, wherein the first resin layer is formed before the second resin layer is formed.

20. The method according to claim 14, further comprising:
forming a recess portion in the second surface of the support substrate before forming the second resin layer, wherein the second resin layer is formed in the recess portion.

* * * * *